(12) United States Patent
Liu (10) Patent No.: US 6,404,276 B1
(45) Date of Patent: *Jun. 11, 2002

(54) INTEGRATED FILTER TUNING METHOD AND APPARATUS

(75) Inventor: Edward Liu, Sunnyvale, CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/095,182

(22) Filed: Jun. 10, 1998

(51) Int. Cl.[7] ................................................. H03K 5/00
(52) U.S. Cl. ..................... 327/553; 327/552; 341/143
(58) Field of Search ................. 322/552, 558, 322/553, 554, 555, 556, 557, 559, 362; 710/69; 341/143; 330/305

(56) References Cited

U.S. PATENT DOCUMENTS

| 5,134,318 | A | * | 7/1992 | Itoh ............................ 327/553 |
| 5,572,163 | A | * | 11/1996 | Kimura et al. ............... 327/552 |
| 5,663,675 | A | * | 9/1997 | O'Shaughnessy ........... 327/553 |
| 5,859,605 | A | * | 1/1999 | Raghvan et al. ............. 341/143 |
| 5,949,820 | A | * | 9/1999 | Shih et al. ..................... 375/22 |
| 6,125,415 | A | * | 9/2000 | Liu ............................... 710/69 |

\* cited by examiner

Primary Examiner—Dinh T. Le (57) ABSTRACT

A transmission system for transmitting a signal from a host to a transmission medium is disclosed. The transmission system includes a current-mode digital-analog converter, an on-chip low-pass filter, a line driver, and output impedance control. Further, a method for transmitting a signal from a host to a transmission medium using on-chip filtering is disclosed. More specifically, an apparatus and method for providing precise control of the filter cut-off frequency at high frequencies is disclosed. The transmission system and method can be used in transmission of Ethernet signals onto an unshielded twisted pair cable. In addition, with appropriate modification, the transmission system and method can be used for transmitting ATM or other signals onto a transmission medium.

30 Claims, 8 Drawing Sheets

INTEGRATED FILTER TUNING METHOD AND APPARATUS

CROSS-REFERENCE TO RELATED APPLICATIONS

The present application is related to U.S. patent applications Ser. No. 09/095,183 U.S. Pat. No. 6,154,784 and 09/095,180 U.S. Pat. No. 6,125,415, filed on even date herewith. Each of these commonly-assigned applications is hereby incorporated by reference.

BACKGROUND OF THE INVENTION

1. Field of the Invention

The present invention relates generally to computer systems and, more particularly, to an apparatus and method for tuning an on-chip filter used in transmitting signals, that meet government emission standards, from a computer system to a transmission medium.

2. Description of the Related Art

Many computer systems today are utilized in a networked configuration where each networked computer can transmit data to other computers on the same network. Various systems and related protocols have been developed over the years to implement such networks, such as Token Ring, Ethernet, and ATM. Depending upon which network is being used, certain requirements must be met, such as the types of hardware used and particular data characteristics.

The Ethernet local area network (LAN) is one of the most popular and widely used computer networks in the world. Since the beginnings of the Ethernet in the early 1970's, computer networking companies and engineering professionals have continually worked to improve Ethernet product versatility, reliability and transmission speeds. To ensure that new Ethernet products were compatible and reliable, the Institute of Electrical and Electronic Engineers (IEEE) formed a working group to define and promote industry LAN standards. Today, the IEEE has various Ethernet working groups that are responsible for standardizing the development of new Ethernet protocols and products under an internationally well known LAN standard called the "IEEE 802.3 standard."

Currently, there are a wide variety of standard compliant Ethernet products used for receiving, processing and transmitting data over Ethernet networks. By way of example, these networking products are typically integrated into networked computers, network interface cards (NICs), routers, switching hubs, bridges and repeaters. Until recently, common data transmission speeds over Ethernet networks were 10 megabits per second (Mbps). However, to meet the demand for faster data transmission speeds, in May 1995 the IEEE 802.3 standards committee officially introduced another standard, the "IEEE 802.3u standard," for a 100BASE-T system capable of performing data transmissions at up to about 100 Mbps. When operating with unshielded twisted pair (UTP) cable as a transmission medium, these networks are commonly referred to as 10BASE-T and 100BASE-T networks.

Figure 1A:
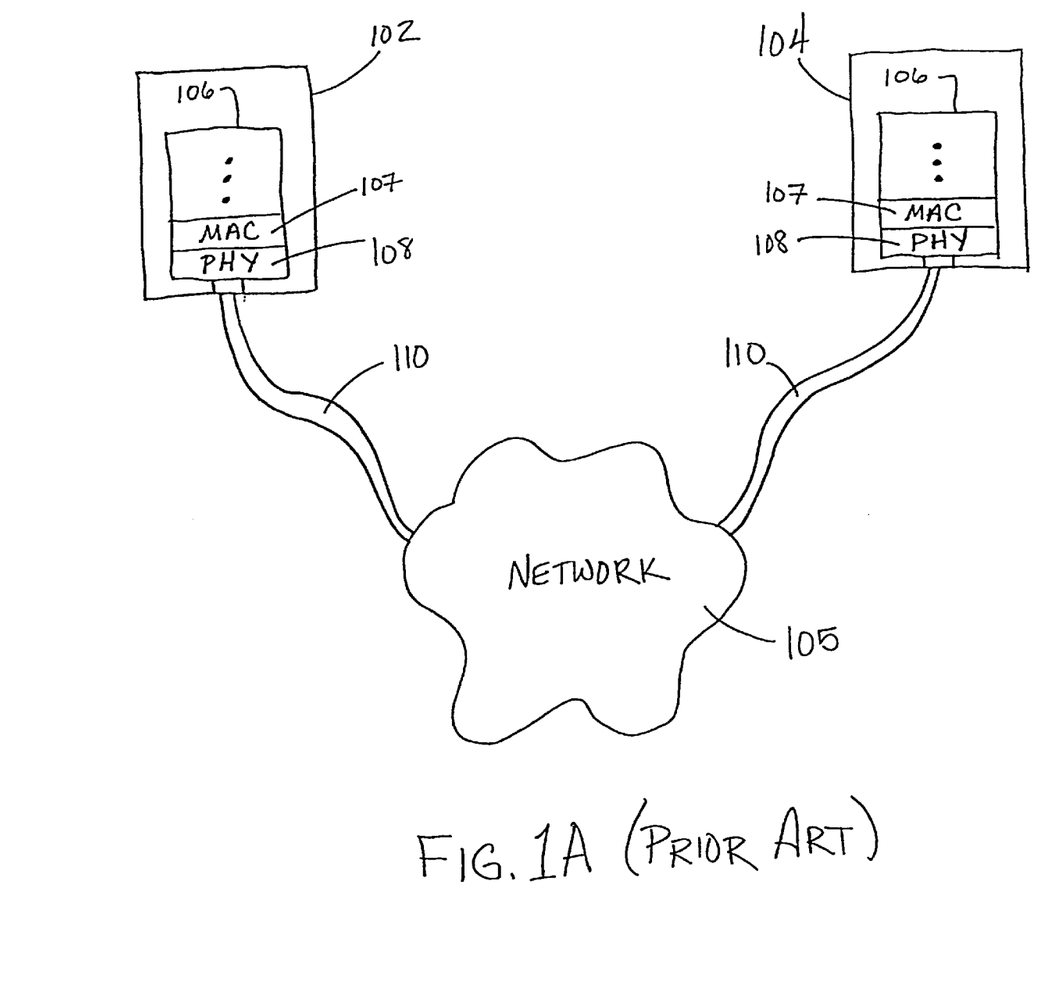
FIG. 1A depicts a schematic of two computers connected through a network according to the prior art.

FIG. 1A is a diagrammatic representation of two computers 102, 104, which are connected through a network 105. The network 105 can include, for example, other computers, network hubs, network routers, servers or the like. Of course, a single cable connecting the computers 102 and 104 can alternatively be used. Each computer 102 and 104 includes systems to facilitate exchange of information to and from the computer. These systems are diagrammatically illustrated by an open systems interconnection (OSI) layered model 106, that was developed by the International Organization for Standards (ISO) for describing the exchange of information between layers. The OSI layered model 106 is particularly useful for separating the technological functions of each layer, and thereby facilitating the modification or update of a given layer without detrimentally impacting the functions of neighboring layers.

Multiple layers (not shown) defined in the OSI model 106 are responsible for various functions, such as providing reliable transmission of data over a network; routing data between nodes in a network; and initiating, maintaining and terminating a communication link between users connected to the nodes. In addition, these layers are responsible for performing data transfers within a particular level of service quality; controlling when users are able to transmit and receive data depending on whether the user is capable of fall-duplex or half-duplex transmission; translating, converting, compressing and decompressing data being transmitted across a medium; and providing users with suitable interfaces for accessing and connecting to a network. Further, the lower portion of the OSI model 106 includes a media access control layer (MAC) 107 which generally schedules and controls the access of data to a physical layer (PHY) 108.

At a lowermost layer of OSI model 106, PHY layer 108 is responsible for encoding and decoding data into signals that are transmitted across a particular medium, such as a cable 110. To enable transmission to a particular medium, the PHY layer 108 includes a physical connector which is configured and operable to receive the cable 110. Also, the cable 110 can take various forms, including that of an unshielded twisted pair (UTP) cable.

When signals are passed through the cable 110 from the PHY layer 108, the potential exists for portions of the signal to emit from the cable 110 when it is an unshielded type, such as a UTP cable. More specifically, the portions which may emit from the cable typically are high frequency components of the signal. Because such emissions can interfere with other electrical devices in the vicinity of the cable 110, the U.S. government has developed stringent emission standards (commonly known as FCC Class A Requirements) to avoid such interference. To comply with such standards, in a the PHY layer the high frequency signal components are typically removed from the primary signal before transmission on the cable 110. As is known in the art, this is commonly referred to as transmit pulse shaping that is followed by reconstruction filtering.

Figure 1B:
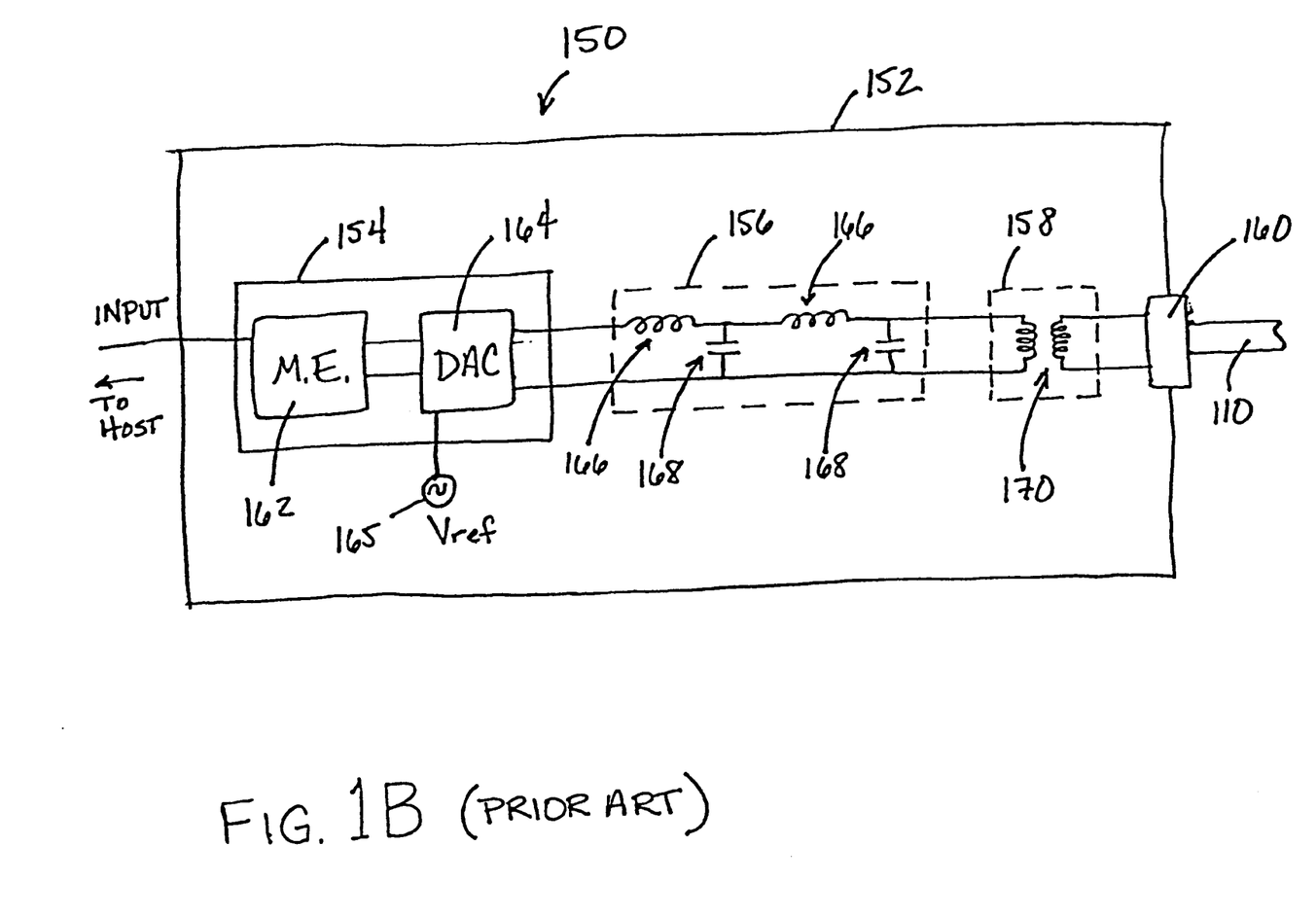
FIG. 1B depicts a schematic of a typical Ethernet transmission system.

Ethernet transmitters have typically utilized a configuration such as that shown in FIG. 1B to remove high frequency components from the signal before transmission through cable 110. FIG. 1B schematically depicts one PHY application of an Ethernet device, specifically an Ethernet card 150. The Ethernet card 150 includes a PC board 152 on which a transmission system, formed by various components, is mounted. Included in these components is a packaged silicon chip 154, a filter 156, a transformer box 158, and a connector 160.

The packaged silicon chip 154 is configured to convert the input binary data from the host (e.g., a computer into which the Ethernet card 150 is mounted) to a signal that can be transmitted to the cable 110. This typically is accomplished by a data converter such as a Manchester encoder 162 and a digital-to-analog converter (DAC) 164 that is integrated on the packaged silicon chip 154. These devices alternatively can be located on separate semiconductor chips that are each mounted onto the PC board 152.

The Manchester encoder 162 outputs a signal having voltage swings that correspond to the binary data. The DAC 164 then converts the digital signal voltage from the Manchester encoder 162 to an analog signal voltage utilizing a reference voltage, Vref 165. Unfortunately, due to power supply or manufacturing process variations, the reference voltage level that is internally generated can vary by as much as about 20%, which can lead to inaccurate and inconsistent signals. In an Ethernet system, this would result in not matching an "Ethernet eye" template, which is a desired Ethernet transmission characteristic.

Electrically connected to the packaged silicon chip 154, the filter 156 operates to remove the high frequency components from the signal passed from the silicon chip 154. This is accomplished by tuning the filter, i.e., setting a cut-off frequency of the filter 156, with frequencies below the cut-off frequency being passed by the filter 156. More specifically, the cut-off frequency can be determined through characteristics of the components which form the filter. Unfortunately, the cut-off frequency will vary with variations in the filter component characteristics; thus large filter component variations can undesirably lead to large cut-off frequency variations. Alternatively, the cut-off frequency can be set by phase-locked loop (PLL) tuning that is well know to those skilled in the art. Unfortunately, though, PLL tuning is often highly complex, potentially adding cost and compromising reliability, and can consume high levels of power. Finally, cut-off frequency can be set by external resistor tuning which typically uses lower amounts of power, and is less complex to implement.

External resistor tuning includes the use of an off-chip resistor to generate bias voltages with a bias circuit, forming a tuning cell. The bias circuit typically is configured such that the bias voltages, and therefore the cut-off frequency, vary with variation of the external resistor resistance. However, such systems may be prone to stability problems. More specifically, a parasitic coupling capacitance Cp that exists due to the physical connection between a feedback bias circuit and external resistor, is shorted out at high frequencies. When the Cp shorts, the bias circuit is caused to have a loop gain that grows beyond unity. Consequently, because the loop gain of the tuning cell continues to grow beyond unity, precise control of the aforementioned cut-off frequencies will not be possible.

Typically, the filter 156 is formed from discrete components located on the PC board 152, such as inductor components 166 and capacitor components 168 used to form an inductor-capacitor (LC) low pass filter, as shown in FIG. 1B. Because discrete components typically require a substantial amount of PC board 152 area for proper layout and routing, the filter 156 tends to occupy a much larger area on the PC board 152 relative to the space utilized by the Manchester encoder 162 and DAC 164 of the packaged silicon chip 154.

The filtered signal passes from the filter 156 through a transformer 170 in transformer box 158, and then to the connector 160 which is configured to receive the cable 110. Although some typical Ethernet systems use a separate filter and a separate transformer, other systems may be in the form of a single module (not shown), which physically incorporates both the filter 156 and transformer 170.

Unfortunately, typical systems do not adequately control the impedance of the signal transmitted to the cable 110 with on-chip resistors which are subject to fabrication variations. Without adequate impedance control, the output voltage levels, specifically the peak-to-peak voltage level (Vpp), may vary beyond acceptable levels. By way of example, for transmission over differential pair lines, such as a UTP cable, such variation may be undesirable, resulting in poor transmission characteristics.

In addition to the components depicted in FIG. 1B, the PC board 152 typically includes several other components. For example, the PC board 152 may further include a processor, terminal circuitry, wiring, routing, connectors to the host (e.g., a computer system), and other semiconductor chips for performing the functions of other layers of the OSI model 106. Also, many of these components require their own routing and integration elements, which uses more space on the PC board 152. Further, as additional functions and components are developed, more space will be needed on the PC board to accommodate those components.

In addition, the marketplace is driving the development of increasingly smaller computers, requiring corresponding decreases in various computer components. This includes a desire to decrease the size of Ethernet systems, such as Ethernet cards. However, any decrease in size of such systems is limited by the relatively large area necessary for routing and integrating the discrete components of the filter 156.

In view of the foregoing, there is a need for methods and apparatuses for Ethernet signal transmission that will utilize less space than current systems. Further, it is desired to have a method and apparatus that better controls the impedance of the signal that is output to a transmission cable. It is also desirable to have a method and apparatus that responds more robustly to power supply and manufacturing process variations that may cause the internally generated voltage to vary by up to about 20%. In addition, it is desired to have a method and apparatus by which the filter cut-off frequency can be set while limiting cut-off frequency variation, maintaining tuning stability at high frequencies, limiting complexity, and limiting power consumption. This is particularly needed as faster and more stable transmission rates are demanded by newer generation transceivers.

SUMMARY OF THE INVENTION

Broadly speaking, the present invention fills these needs by providing an apparatus and method for current-mode transmission of Ethernet signals onto a cable, with output impedance control and on-chip filtering that is tuned using an external resistor in conjunction with compensation. It should be appreciated that the present invention can be implemented in numerous ways, including as a process, an apparatus, a system, a device or a method. Several inventive embodiments of the present invention are described below.

In one embodiment, a transmission system for passing a signal, representing data from a computer system, to a transmission cable, includes a filter, located on a complementary metal-oxide-semiconductor (CMOS) chip, for removing high frequency components from the signal and passing other components of the signal. The filter is configured to receive the signal representing data from the computer system and configured to output a filtered signal to the transmission cable. The transmission system further includes a tuning cell with compensation that is electrically connected to the filter for setting a cut-off frequency of the filter. Preferably, the compensation is accomplished by a low pass filter that is included in the tuning cell.

In another embodiment, a method for making a transmission system for communicating data from a host through a transmission medium includes integrating a filter, on a CMOS chip, that is configured to remove particular portions of a filter input signal, that represents the data, and to pass remaining portions as a filtered signal, with the particular portions being determined relative to a cut-off frequency. The method further includes integrating a tuning cell onto the CMOS chip, the tuning cell being configured to set the cut-off frequency. In addition, the tuning cell is further integrated with a stability damping circuit.

In yet another embodiment of the present invention, an apparatus for transmitting data from a computer system to a transmission medium includes a means for removing particular components of an input signal and passing other components of the input signal. The means for removing particular components is integrated on a complementary metal oxide-semiconductor (CMOS) chip and the particular components are determined by a cut-off frequency. The apparatus further includes a means for setting the cut-off frequency, that is at least partially incorporated on the CMOS chip such that the means for setting the cut-off frequency includes a stabilization means.

One advantage of the present invention is that less PC board space is used by the Ethernet transmitter. More specifically, because the filter is integrated on-chip, the space typically used by discrete components for the filter is not needed. Thus, the unused space can either be used by additional components on the PC board, or the size of the PC board itself can be reduced. Also, by avoiding the use of discrete components, the cost of the device is correspondingly decreased. In one embodiment of the present invention, the cost of a system is dramatically reduced by integrating the entire transmitter system on-chip, which should be contrasted with the cost of a transmitter system that requires PC board integrated discrete components. In some cases, the total cost of the transmitter system can increase by more than 20 times when discrete components are conventionally used to perform the filtering functions.

An additional advantage of the present invention is that the signal transmission is more robust in response to variations in power supply and manufacturing processes because it operates in current mode. In particular, this results in more consistent transmission signal levels being output to the Ethernet cable, for example. As a further advantage of the present invention, the output impedance is accurately controlled while converting the signal from current to voltage with the proper signal levels, including the proper peak-to-peak voltage (Vpp).

The present invention further advantageously provides for on-chip filter tuning while limiting cut-off frequency variation, complexity, and power consumption and maintaining tuning stability at higher frequencies.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention for transmitting an Ethernet signal including on-chip filtering, that is tuned using an external resistor with compensation, is disclosed. In the following description, numerous specific details are set forth in order to provide a thorough understanding of the present invention. It will be understood to one skilled in the art, however, that the present invention may be practiced without some or all of these specific details. In other instances, well known process operations have not been described in detail in order not to unnecessarily obscure the present invention.

Figure 2:
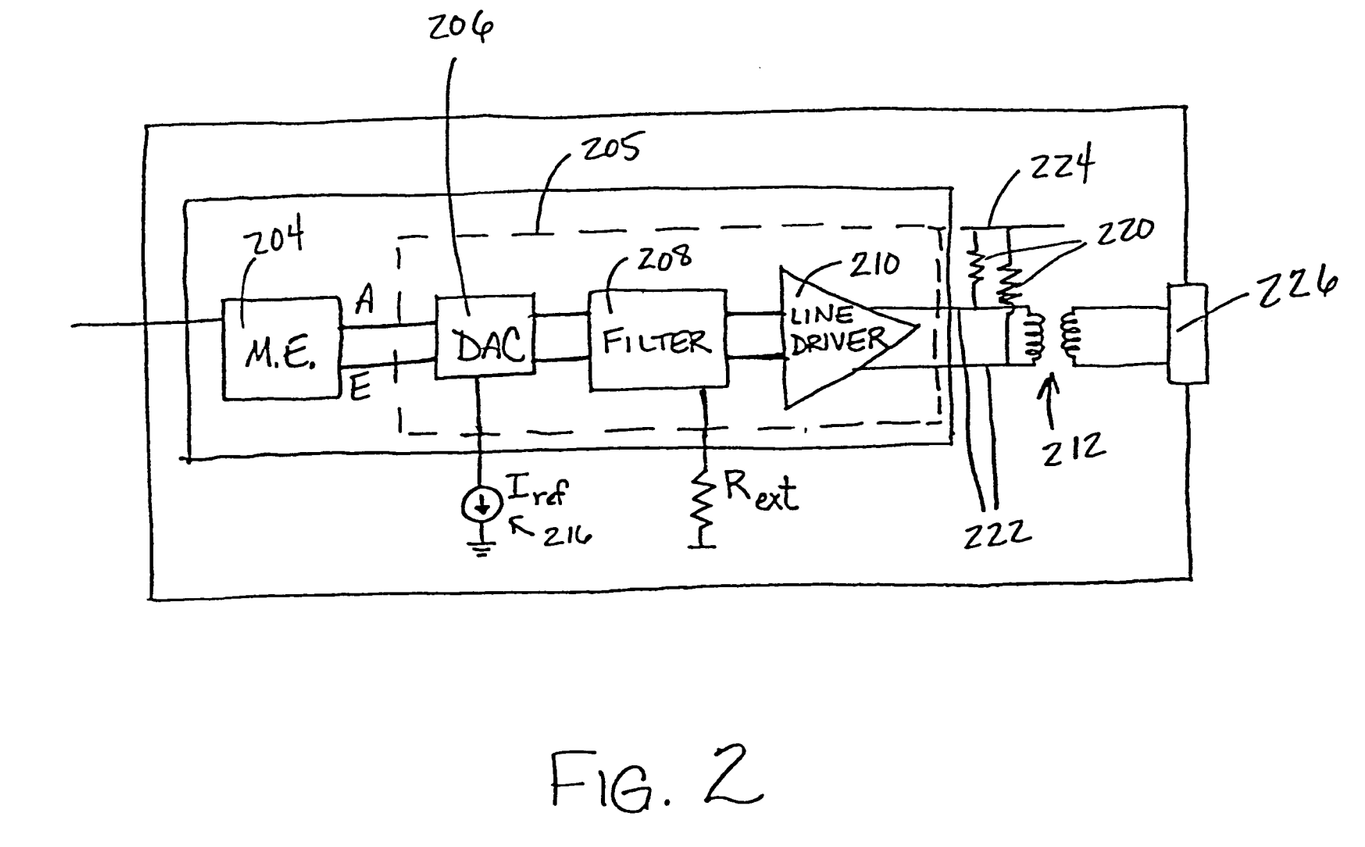
FIG. 2 depicts a schematic of an Ethernet transmission system according to one embodiment of the present invention.

FIG. 2 depicts an Ethernet card 200 incorporating an Ethernet transmission system 202. The Ethernet transmission system 202 includes a Manchester encoder 204 electrically connected to a mixed-signal block 205 and to a transformer 212. The mixed-signal block 205 includes a digital-to-analog converter (DAC) 206, a filter 208, and a line driver 210. Also electrically connected to the mixed signal block 205 are a reference current (Iref) 216, and an external resistor Rext. In addition, pull-up resistors 220 are connected to lines 222, which connect the line driver 210 and the transformer 212. Resistors 220 are also connected to a rail voltage 224. In addition, to provide physical connection between Ethernet transmission system 202 and a cable (not shown), the Ethernet transmission system 202 includes a connector 226.

The Manchester encoder 204 is configured to receive binary data from a host, such as computer system 102, to which the Ethernet card 200 is coupled. The Manchester encoder 204 can receive binary data at various rates, such as 10 Mbps, which corresponds to a 10BASE-T Ethernet signal. The Manchester encoder 204 is further configured to act as a signal generator, encoding the binary data into a digital signal voltage A (primary signal), which has a voltage that rises and falls in accordance with changes in the binary data.

Because there may be delays in the transmission of the signal at points where the signal is rising or falling, due to the particular electrical properties of the transmission cable, which delay charging and discharging of the cable, it is desired to increase the signal at these points of signal switching. To facilitate this increase, the Manchester encoder 204 is configured to generate a pre-emphasis signal E (secondary signal), which is set to be the inverse of the unit delay of A, for example, E(n)=A(n)−(1)'. Using the pre-emphasis signal E and an exclusive NOR gate (not shown) as a signal switch detector, the Ethernet transmission system 202 detects when the signal generated by the Manchester encoder 204 switches between levels. When a switch is detected, the digital-to-analog converter 206 can act as a signal enhancer to obtain the necessary signal level.

The digital-to-analog converter (DAC) 206 of the present invention is a two-bit current-switched device. In addition to converting the signal A from a digital primary signal to an analog primary signal, it is configured to produce a current, I, as a modified primary signal having one of four current levels according to the values of pre-emphasis signal E and signal A. In one embodiment of the present invention, the DAC 206 is formed on a complementary metal-oxide semiconductor (CMOS) chip. Thus, current-mode is used because a precision bandgap reference voltage, necessary for a voltage-output DAC, is not available when a digital CMOS process is used. Also, because power supply and manufacturing process variations may cause variations in internally generated voltages of about up to 20%, the transmission system of one embodiment of the present invention is made more robust by operating in current-mode. Accordingly, the digital-to-analog converter 206 operates in conjunction with the reference current Iref 216, to generate a precise output signal current, the value of which depends upon the values of the pre-emphasis signal E and signal A.

Filter 208 is a low-pass filter that is configured to remove the high frequency components of an input signal white passing other, lower frequency components (e.g., the filtered primary signal) according to a set cut-off frequency. In this embodiment of the present invention, the filter 208 is advantageously integrated on a CMOS chip and formed of a combination of CMOS devices. By forming the filter 208 on-chip, the amount of PC board space occupied by the transmitter is significantly decreased, compared to conventional transmitters that implement discrete component filters. Accordingly, the cost of the transmission system can be reduced by about 95% by using the on-chip filter of the present invention.

Figure 3:
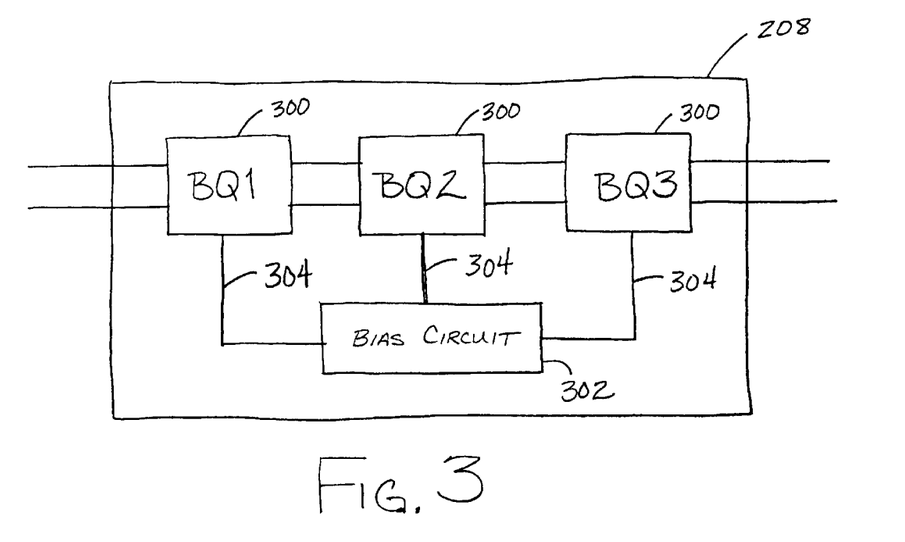
FIG. 3 depicts a schematic of components forming a filter of the Ethernet transmission system of FIG. 2, according to one embodiment of the present invention.
Figure 6A:
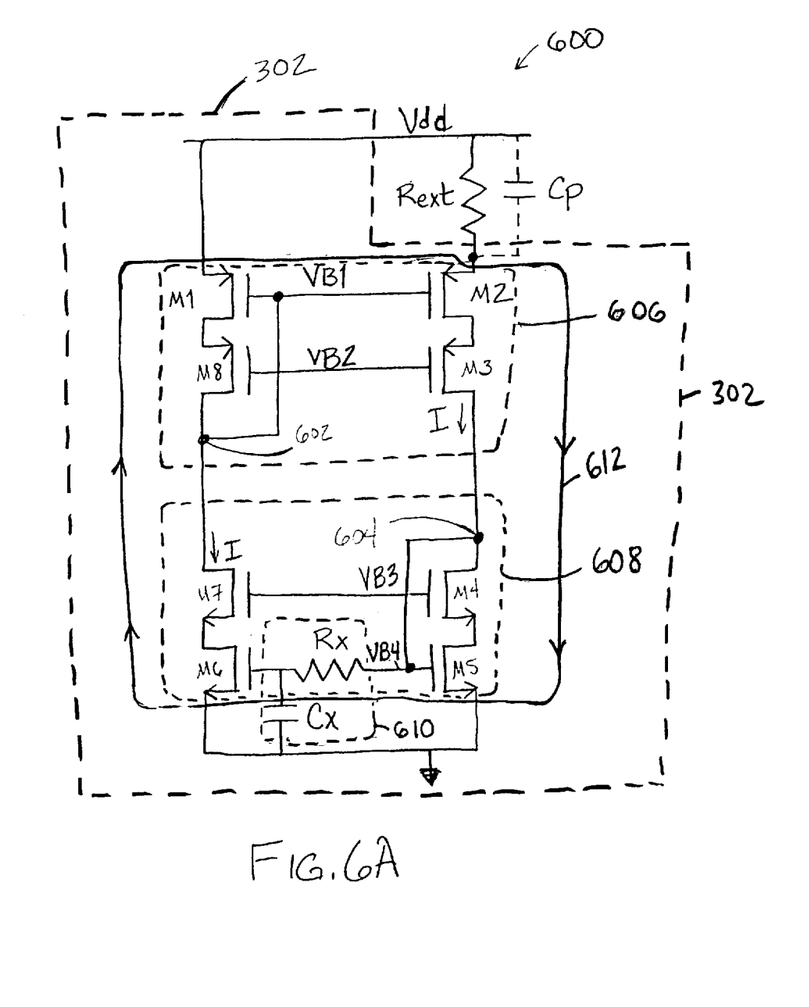
FIG. 6A is a schematic diagram of a tuning cell, according to one embodiment of the present invention.
Figure 6B:
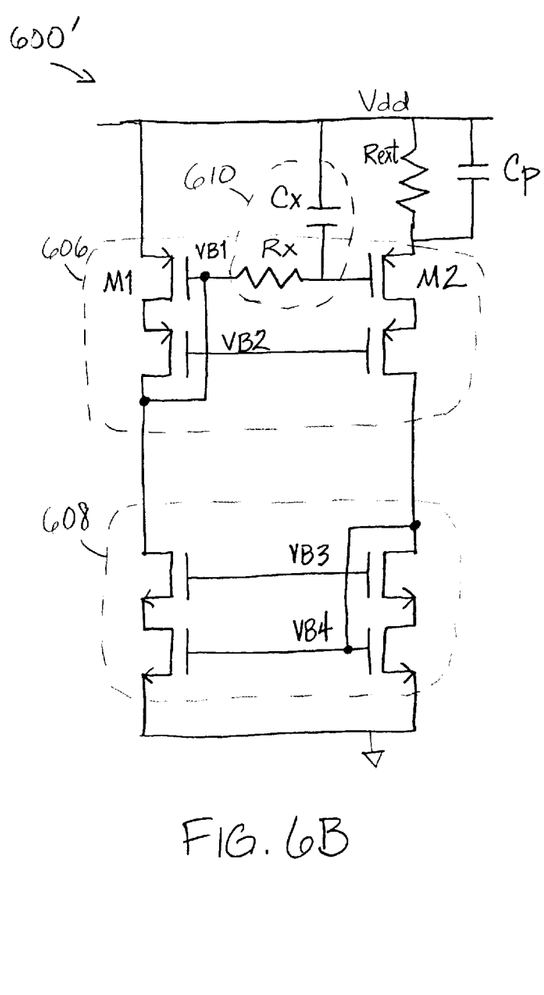
FIG. 6B is a schematic diagram of a tuning cell, according to another embodiment of the present invention.

FIG. 3 depicts a schematic representation of the filter 208 according to one embodiment of the present invention where filter 208 is a fully differential current-mode Butterworth Gm-C filter. The filter 208 includes three cascaded semiconductor devices (biquads) 300. Each biquad 300 simulates a parallel RLC tank circuit. While three biquads 300 are depicted in FIG. 3, other appropriate multiples of biquads 300 can be used. The filter 208 also includes a bias circuit 302 which is connected by wires 304 to each of the biquads 300. As will be further described below, a tuning cell as shown in FIGS. 6A and 6B below, operates with Rext (shown in FIG. 2), to set, precisely, the cut-off frequency of the filter 208 at high frequencies, without the stability problems of conventional tuning cells.

Figure 4:
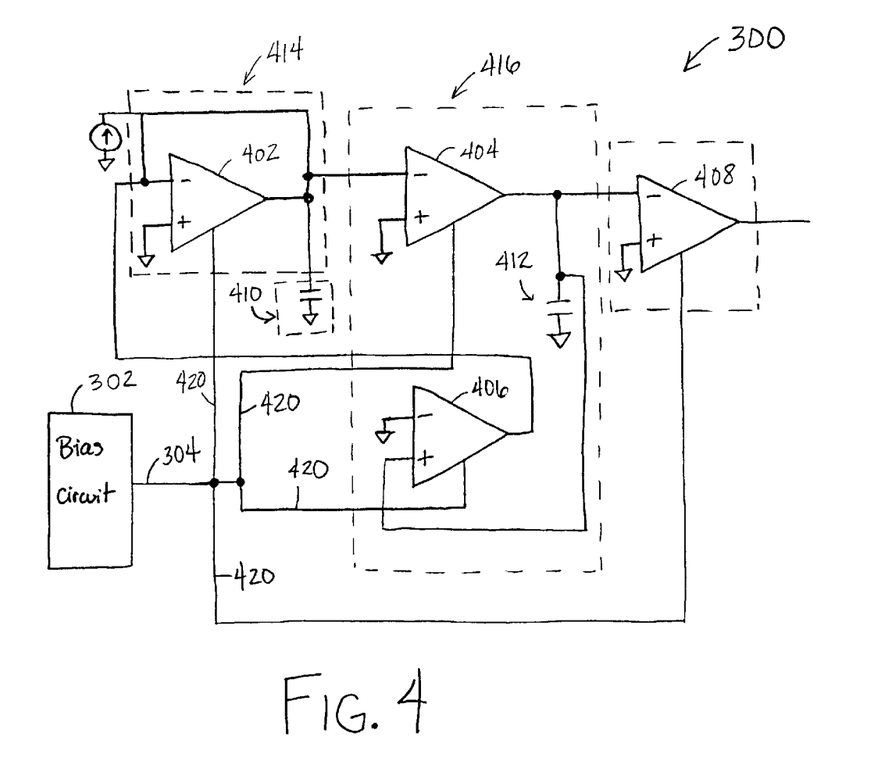
FIG. 4 is a schematic diagram of one of the biquads and the bias circuit of FIG. 3, according to one embodiment of the present invention.

A schematic of the constituents of each biquad 300 is shown, in single-ended form for clarity, in FIG. 4. Each biquad includes four identical circuit (but possibly differently sized) transconductance cells 402, 404, 406 and 408, and two capacitors 410 and 412. A feedback electrical configuration 414 of the transconductance cell 402 simulates a resistor, while the combination 416 of the transconductance cells 404 and 406 with the capacitor 412 simulates an inductor. The RLC circuit is completed by the capacitor 410, while the transconductance cell 408 operates as a voltage to current converter. It should be noted that the capacitors of each biquad preferably are accumulation transistors. In the shown configuration, it is the transconductance of each of the transconductance cells that controls the cut-off frequency of the filter 208. Thus, it is by affecting the transconductances of the transconductance cells that form the biquads of the filter, that the bias circuit 302 and Rext control the filter cut-off frequency.

To have such an effect, FIG. 4 illustrates that the bias circuit 302 is electrically connected via wire (i.e., semiconductor interconnect structure) 304 to each of the transconductance cells 402, 404, 406 and 408 of a biquad 300. The wire 304 may be a single wire that is then connected to the transconductance cells 402, 404, 406 and 408 via the wires 420, or a set of wires 420. In turn, each wire 420 may be a single wire of set of wires. Either way, each of the wires 420 connect the bias circuit 302 to a single transconductance cell to affect its transconductance.

Figure 5:
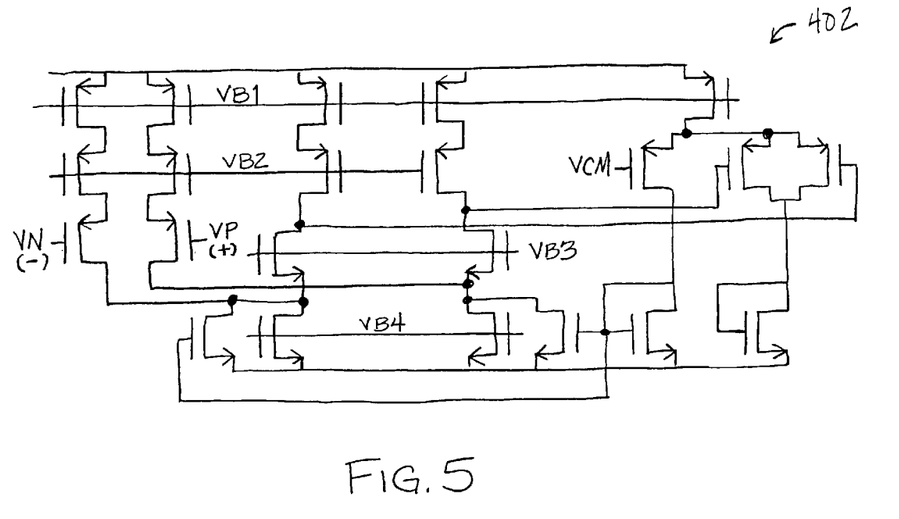
FIG. 5 is a schematic diagram of a transconductance cell included in the biquad of FIG. 4, according to one embodiment of the present invention.

The transconductance cell 402 is shown in FIG. 5 as having a simple folded cascode structure with common-mode feedback. The transconductance cell 402 is powered by a positive voltage Vp, a negative voltage Vn, and common mode voltage Vcm, each of which may have a variety of values that can be used to provide adequate biasing. For example, Vp can be approximately 5V, while Vn is approximately 0V and Vcm is approximately half the rail voltage Vdd. The transconductance of the transconductance cell 402 is controlled by the bias voltages VB1, VB2, VB3 and VB4, each of which are supplied by the bias circuit 302 in conjunction with the external resistor Rext. Although transconductance cell 402 is shown here, each of the transconductance cells of the filter 208 are similarly constructed and tuned by the bias circuit and external resistor.

FIG. 6A depicts a tuning cell 600 being supplied with a rail voltage Vdd and ground, according to an embodiment of the present invention. Tuning cell 600 includes the bias circuit 302 and the external resistor Rext, which is preferably integrated onto a printed circuit board off-chip. The bias circuit is formed by a first current mirror 606 and a second current mirror 608. The first and second current mirrors 606, 608 operate to maintain the same current I at point 602 as at point 604. Given the configuration shown in FIG. 6A, by making transistor M1 four times smaller than transistor M2, the transconductance of M1 is one half that of M2, and equal to the inverse of the resistance of Rext. With such a configuration, changing the resistance of Rext, causes the bias voltages VB1–VB4 to be generated such that the resulting transconductance of the tuned transconductance cell is equal to 1/Rext. Thus, the tuning cell is configured such that the transconductance is inversely proportional to the set resistance of Rext.

However, due to the physical connection between the bias circuit 302 and the external resistor Rext, a parasitic coupling capacitance Cp is also produced along the Rext of the tuning cell 600. In addition, the tuning cell exhibits a loop gain along the path 612. Because the tuning cell 600 is a feedback circuit, the parasitic coupling capacitance Cp is shorted out at higher frequencies, thus introducing stability problems that are evidenced by a loop gain along the path 612 that grows beyond unity.

Figure 6C:
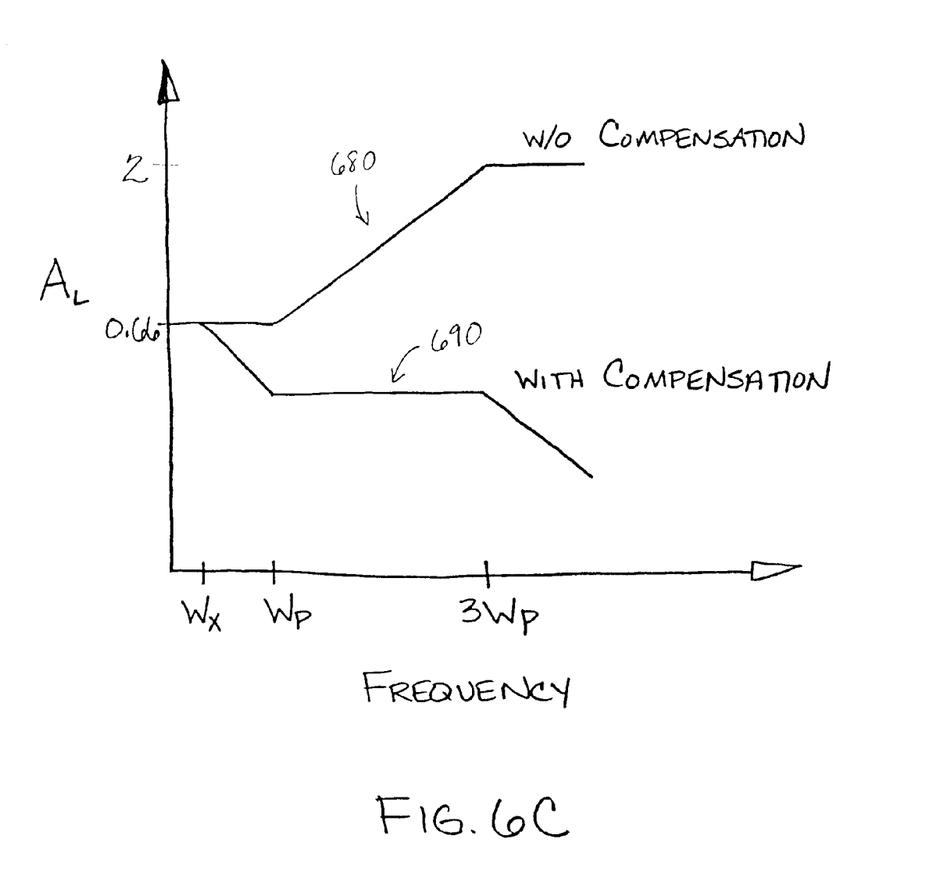
FIG. 6C is a graph of the variation of the tuning cell loop gain with varying frequency, according to one embodiment of the present invention, compared with an uncompensated tuning cell.

Such stability problems can be better understood with reference to the loop gain $AL(s)$ that would occur in the tuning cell 600 excluding a damping circuit 610 that is integrated as part of current mirror 608, the loop gain being given by:

$$AL(s) = \frac{gm2}{gm1} \frac{(1 + (s \cdot \text{Rext} \cdot \text{Cp}))}{(1 + s \cdot \text{Rext} \cdot \text{Cp} + gm2\text{Rext})} = \frac{2(1 + (s \cdot \text{Rext} \cdot \text{Cp}))}{(3 + (s \cdot \text{Rext} \cdot \text{Cp}))}$$

$$= \frac{2(Wp + s)}{(3Wp + s)}$$

where Wp=1/(RextCp). As shown by line 680 in FIG. 6C, at low frequencies, less than Wp, the source degeneration provided by Rext limits the loop gain to approximately two-thirds, which is less than unity and thus stable. However, at higher frequencies, above 3Wp, the parasitic coupling capacitance Cp can short out the source degeneration, whereby the loop gain can increase up to 2 (i.e., greater than unity), resulting in an unstable circuit.

To avoid such instability at higher frequencies, the damping circuit 610, in the form of a low pass filter, is included in the second current mirror 608 between the gates of transistors M6 and M5. In this embodiment, the lowpass filter is defined by a resistor Rx and capacitor Cx. This introduces a dominant pole, Wx=1/(RxCx) which compensates for the degeneration effects of Cp, resulting in the loop gain illustrated by line 690 in FIG. 6C. As FIG. 6C shows, the loop gain is maintained at levels less than unity, and therefore the circuit remains stable.

FIG. 6B is a schematic of a tuning cell 600' according to another embodiment of the present invention. In this embodiment, the damping circuit 610 is located in the first current mirror 606 between the gates of transistors M1 and M2. The damping circuit 610 similarly compensates for the parasitic coupling capacitance and limits the loop gain as shown by line 690 in FIG. 6C. Thus, this embodiment also provides stable filter tuning at higher frequencies, which is needed as faster and more stable transmission rates are demanded by newer generation transceivers.

Referring again to FIG. 2, the signal that is passed by the filter 208 is received by the line driver 210. The line driver 210 is configured to prepare the signal for launch to a cable, such that the signal is optimized for the particular characteristics of the cable being used. The line driver in this embodiment is used to amplify the current that is received from the filter 208 output, to a full scale current level that is more suitable for transmission through a physical medium (e.g., a cable). For example, in one embodiment of the present invention, the line driver 210 is configured to amplify an input signal of about 100 μA that is generated on-chip, to an output signal of about 100 mA. In addition, to avoid introducing distortion during amplification, a class A driver is chosen for its good anti-distortion performance, but of course, a lower power class AB design could also be used. Further, it is desired that the line driver 210 be chosen so as to reject DC offsets from the filter 208 to avoid premature saturation.

Each network system (e.g., Ethernet 10BASE-T or 100BASE-T) may require a particular differential for the voltage output to the transmission medium. For example, Ethernet 10BASE-T requires a peak-to-peak voltage (Vpp) of 5V. As shown in FIG. 2, the pull-up resistors 220 and rail voltage 224 are configured to convert the current output from the line driver 210 to a voltage (e.g., voltage-modified primary signal) and to modify the signal to have a Vpp that is appropriate for the transmission medium that is to be used. For example, in one embodiment of the present invention where the current output from line driver 210 is about 100 mA, the rail voltage 224 is 5V, and the transmission cable is a UTP cable, 50 ohm resistors are used to output a signal with a Vpp of 5V. Of course, in other embodiments other values can be used to accommodate other types of transmission media and network systems.

In addition, the transmission system further includes a transformer 212 through which the signal passes. It should be noted that, because the filtering is performed on-chip, a relatively inexpensive transformer-only module (not including an external filter) is used. After the transformer, the signal is finally launched onto the cable 110 through the connector 226.

Figure 7:
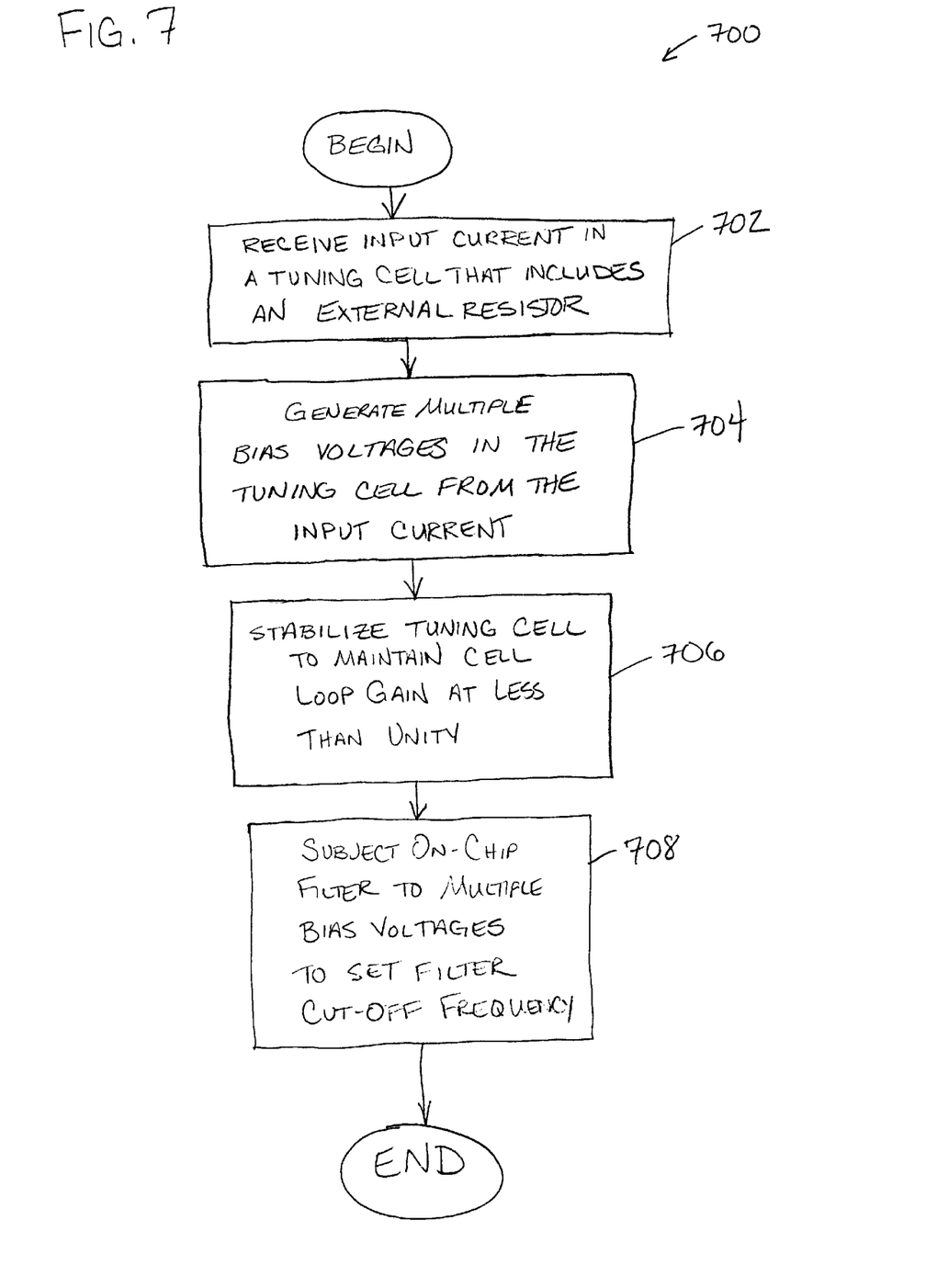
FIG. 7 is a flow chart of a method for tuning an on-chip filter, according to one embodiment of the present invention.

A method 700 for tuning an on-chip filter is shown in the flowchart of FIG. 7. After beginning, an input current is received in operation 702 by a timing cell that includes an external resistor. As discussed above, the external resistor necessary has an associated parasitic coupling capacitance Cp. Further, this Cp fails to stabilize the tuning cell at higher frequencies. The input current is used in operation 704 to generate multiple bias voltages in the tuning cell. In an embodiment of the present invention, the bias voltages are generated by passing the input current through multiple transistors of varying size. While generating the bias voltages, in operation 706 the tuning cell is stabilized to maintain cell loop gain at values that are less than unity. In an embodiment of the present invention, this is accomplished by a damping circuit, or low pass filter, incorporated in the tuning cell, which compensates for the destabilizing effects of the parasitic coupling capacitance. The bias voltages generated in operation 704 are then subjected to an on-chip filter for setting a cut-off frequency of the filter, thus defining the frequency levels that can be passed by the filter.

The Manchester encoder 204, DAC 206, filter 208, and line driver 210 may each be formed on separate CMOS chips. Alternatively, however, other combinations of these devices can be located on a single chip or a single module that can be individually connected or removed from the PC board. For example, the DAC 206, filter 208, and line driver 210 can be formed in a single module, while the Manchester encoder is formed in a separate module on the same IC chip.

Although one embodiment of the present invention is configured to transmit 10BASE-T Ethernet signals, the transmission system of the present invention can be used to transmit Ethernet signals at other speeds, with appropriate modification of the above described components. Also, the present invention can be configured to transmit other types of signals, such as ATM signals, by making appropriate modifications to the components of the present invention.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A transmission system for transmitting a signal having predetermined frequency ranges and voltage levels representing data for a computer system, to a transmission medium, the transmission system comprising:

a digital to analog converter operating in current mode to control signal voltage levels, the digital to analog converter receiving the signal and converting the signal from a digital format to an analog format;

an integrated filter coupled to the digital to analog converter, the integrated filter for removing select frequency components from the signal, the filter being configured to receive the signal and output a filtered signal for provision to the transmission medium; and a tuning cell coupled to and integrated on a common substrate with the filter and the digital to analog converter for setting a cut-off frequency of the filter, the tuning cell having compensation circuitry that at least partially counteracts parasitic capacitances of the tuning cell to control signal frequency ranges.

2. A transmission system as recited in claim 1, wherein the filter comprises:
   a plurality of cascaded semiconductor circuits configured to operate as discrete parallel resistor-inductor-capacitor (RLC) circuits, each semiconductor circuit comprising:
   a plurality of transconductance cells; and
   a plurality of capacitors coupled to the plurality of transconductance cells.

3. A transmission system as recited in claim 2, wherein each of the plurality of transconductance cells has a folded cascode structure with common-mode feedback.

4. A transmission system as recited in claim 1, the filter comprising at least one transconductance cell, wherein the tuning cell is configured to set the cut-off frequency of the filter by controlling a transconductance of the at least one transconductance cell.

5. A transmission system as recited in claim 4, wherein the tuning cell comprises a resistor; and
   wherein the tuning cell is configured to control the transconductance of the at least one transconductance cell such that the transconductance is approximately inversely proportional to the resistance of the resistor.

6. A transmission system as recited in claim 5, wherein the resistor is an external resistor.

7. A transmission system as recited in claim 1, wherein the tuning cell comprises a resistor.

8. A transmission system as recited in claim 7, wherein the resistor is an external resistor.

9. A transmission system as recited in claim 7, wherein the compensation circuitry comprises a lowpass filter.

10. A transmission system as recited in claim 2, wherein the transconductance cells and plurality of capacitors are electrically arranged such that:
    a transconductance cell is configured to provide an effective resistance;
    a plurality of tramsconductance cells are configured in association with a capacitor to provide an effective inductance; and
    an accumulation transistor structure is configured to provide an effective capacitance.

11. The transmission system as recited in claim 1, wherein the filter is configured such that the filtered signal is an Ethernet-compliant signal.

12. The transmission system as recited in claim 11, wherein the Ethernet-compliant signal is one of an about 10 Mbps signal or an about 100 Mbps signal.

13. The transmission system as recited in claim 10, further comprising:
    a data encoder for generating a digital signal having a particular one of a first and a second voltage level in response to binary data from the computer system;
    a digital-to-analog converter coupled between the data encoder and the filter, for converting the digital signal generated by the data encoder to an analog signal which is provided to the filter; and
    a line driver electrically coupled to the filter, configured to amplify the filtered signal to generate an amplified signal, and further configured to provide the amplified signal to the transmission medium.

14. A method for communicating data from a host to a transmission medium using an output signal having predetermined voltage levels and frequency ranges, the method comprising.

providing a digital to analog converter operating in current mode to convert an input signal from a digital format to an analog format to control the voltage levels of the output signal; and providing an integrated filter for removing select frequency components from the input signal, thereby generating a filter signal, die integrated filter comprising a tuning cell having a damping circuit that at least partially counteracts parasitic capacities of the tuning cell to control the frequency ranges of the output signal.

15. A method as recited in claim 14, wherein the select frequency components are relatively high frequency components.

16. A method as recited in claim 14, wherein the damping circuit comprises a low pass filter to provide loop stability.

17. A method as recited in claim 16, further comprising:
    providing an external resistor, the value of the resistor determining which frequency components are removed from the input signal.

18. A method as recited in claim 16, wherein the low pass filter counteracts parasitic capacitances associated with the external resistor.

19. A method as recited in claim 14, further comprising:
    providing an encoder to generate a signal that is representative of data from the host, such that the filter input signal is based, at least in part, on the signal.

20. A method as recited in claim 19, wherein the signal is converted from a digital format to an analog format, and then used as the filter input signal.

21. A method as recited in claim 19, further comprising:
    providing a line driver configured to receive the filtered signal, the line driver being further configured to amplify the filtered signal and to transmit the amplified filtered signal to the transmission medium.

22. The method as recited in claim 16, wherein the step of providing an integrated filter comprises:
    providing a plurality of transconductance cells; and
    providing a plurality of capacitors electrically coupled to the plurality of transconductance cells, such that the resultant electrical configuration operates as a particular combination of resistances, inductances and capacitances.

23. The method as recited in claim 22, the providing of the plurality of capacitors comprising providing n well capacitors.

24. A method as recited in claim 22, wherein the tuning cell is further configured to set the cut-off frequency of the filter by controlling a transconductance of each of the plurality of transconductance cells.

25. A method as recited in claim 16, wherein the integrated filter is formed by a complementary metal-oxide-semiconductor process.

26. An apparatus for transmitting data from a computing device to a transmission medium using an output signal having predetermined voltage levels and frequency ranges, the apparatus comprising:
    means for converting an input signal from a digital format to an analog format, the mew for converting operating in a current mode to control the voltage levels of the output signal;
    means for removing particular components of the input signal and outputting other components of the input signal, the means for removing particular components being integrated on a semiconductor substrate, the particular components being determined by a cut-off frequency; and means for seeing the cut-off frequency, at least partially incorporated on the semiconductor substrate such the means for setting the cut-off frequency includes a stabilization means that at least partially counteracts parasitic capacitances associated with the means for setting the cut-off frequency to control the frequency ranges of the output signal.

27. An apparatus as recited in claim 26, wherein the means for removing particular components of the signal includes a plurality of transconductance cells electrically connected to a plurality of capacitive elements, and wherein the means for setting the cut-off frequency is configured to control the transconductance of the transconductance cells.

28. An apparatus as recited in claim 27, wherein the means for setting the cut-off frequency comprises:
   an external resistance having an associated coupling capacitance the stabilization means configured to compensate for the coupling capacitance.

29. An apparatus as recited in claim 26, the apparatus further comprising:
   means for converting binary data received from the computer system, to a digital signal having a voltage varying in accordance with the binary data;
   means for converting the digital signal to an analog signal current having high frequency components, such that the analog signal current is the input signal; and
   means for converting the other portions of the signal to a voltage before the other portions of the signal are transmitted to the transmission medium, such that the signal is modified to have a particular peak-to-peak voltage.

30. The apparatus as recited in claim 26, wherein the stabilization means comprises a low pass filter.

* * * * *